US008525286B2

(12) United States Patent
Hsu et al.

(10) Patent No.: US 8,525,286 B2
(45) Date of Patent: *Sep. 3, 2013

(54) METHOD OF MAKING WAFER STRUCTURE FOR BACKSIDE ILLUMINATED COLOR IMAGE SENSOR

(75) Inventors: Tzu-Hsuan Hsu, Kaohsiung (TW); Chris Hsieh, Hsinchu (TW); Dun-Nian Yaung, Taipei (TW); Chung-Yi Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 55 days.

This patent is subject to a terminal disclaimer.

(21) Appl. No.: 12/537,167

(22) Filed: Aug. 6, 2009

(65) Prior Publication Data

US 2009/0294886 A1 Dec. 3, 2009

Related U.S. Application Data

(63) Continuation of application No. 11/626,664, filed on Jan. 24, 2007, now Pat. No. 7,638,852.

(60) Provisional application No. 60/798,876, filed on May 9, 2006.

(51) Int. Cl.
*H01L 31/00* (2006.01)

(52) U.S. Cl.
USPC .................. 257/440; 257/E31.002

(58) Field of Classification Search
USPC ............... 257/414, 428, 431, 432, 443, 447, 257/E31.119, E31.12, E31.121
See application file for complete search history.

(56) References Cited

U.S. PATENT DOCUMENTS

| 3,617,753 | A |   | 11/1971 | Kato et al. |
|---|---|---|---|---|
| 3,995,309 | A |   | 11/1976 | Torreno, Jr. |
| 4,001,878 | A | * | 1/1977 | Weimer ................. 348/280 |
| 4,154,632 | A |   | 5/1979 | Mochizuki et al. |
| 4,190,852 | A |   | 2/1980 | Warner, Jr. |
| 4,193,826 | A |   | 3/1980 | Mochizuki et al. |
| 4,199,386 | A |   | 4/1980 | Rosnowski et al. |

(Continued)

FOREIGN PATENT DOCUMENTS

| CN | 1229526 | 9/1999 |
|---|---|---|
| CN | 1763965 | 4/2006 |

(Continued)

OTHER PUBLICATIONS

Williams, George M., "Back-Illuminated CCD Imagers for High Information Content Digital Photography", SPIE, vol. 3302, Apr. 1998, pp. 39-53.

(Continued)

*Primary Examiner* — Michael Lebentritt
*Assistant Examiner* — Kevin Quinto
(74) *Attorney, Agent, or Firm* — Haynes and Boone, LLP

(57) ABSTRACT

An integrated circuit device is provided. The integrated circuit device can include a substrate; a first radiation-sensing element disposed over a first portion of the substrate; and a second radiation-sensing element disposed over a second portion of the substrate. The first portion comprises a first radiation absorption characteristic, and the second portion comprises a second radiation absorption characteristic different from the first radiation absorption characteristic.

20 Claims, 4 Drawing Sheets

(56) References Cited

U.S. PATENT DOCUMENTS

| | | | |
|---|---|---|---|
| 4,290,830 A | | 9/1981 | Mochizuki et al. |
| 4,481,522 A | * | 11/1984 | Jastrzebski et al. ............ 257/229 |
| 4,507,674 A | | 3/1985 | Gaalema |
| 4,760,031 A | | 7/1988 | Janesick |
| 4,764,480 A | | 8/1988 | Voca |
| 5,005,063 A | | 4/1991 | Janesick |
| 5,244,817 A | | 9/1993 | Hawkins et al. |
| 5,473,181 A | | 12/1995 | Schwalke et al. |
| 5,508,625 A | | 4/1996 | Adams |
| 5,511,428 A | | 4/1996 | Goldberg |
| 5,661,043 A | * | 8/1997 | Rissman et al. ............. 438/162 |
| 5,792,377 A | | 8/1998 | Belcher et al. |
| 5,895,944 A | | 4/1999 | Yamada |
| 5,900,623 A | | 5/1999 | Tsang |
| 6,012,336 A | | 1/2000 | Eaton et al. |
| 6,168,965 B1 | | 1/2001 | Malinovich et al. |
| 6,169,319 B1 | | 1/2001 | Malinovich et al. |
| 6,227,055 B1 | | 5/2001 | Pitzer |
| 6,259,085 B1 | | 7/2001 | Holland |
| 6,269,199 B1 | | 7/2001 | Maloney |
| 6,331,873 B1 | | 12/2001 | Burke et al. |
| 6,429,036 B1 | | 8/2002 | Nixon et al. |
| 6,501,092 B1 | | 12/2002 | Nikonov et al. |
| 6,504,193 B1 | | 1/2003 | Ishiwata et al. |
| 6,504,196 B1 | | 1/2003 | Rhodes |
| 6,518,085 B1 | | 2/2003 | Wang et al. |
| 6,552,712 B1 | | 4/2003 | Koizumi |
| 6,635,912 B2 | | 10/2003 | Ohkubo |
| 6,670,258 B2 | | 12/2003 | Carlson et al. |
| 6,765,276 B2 | | 7/2004 | Fasen et al. |
| 6,815,791 B1 | | 11/2004 | Dierickx |
| 6,821,809 B2 | | 11/2004 | Abe et al. |
| 6,849,469 B1 | | 2/2005 | Thuruthiyil et al. |
| 6,884,651 B2 | | 4/2005 | Toyoda et al. |
| 6,946,352 B2 | | 9/2005 | Yaung |
| 7,005,637 B2 | | 2/2006 | Costello et al. |
| 7,042,060 B2 | | 5/2006 | Costello et al. |
| 7,074,639 B2 | | 7/2006 | Burke et al. |
| 7,148,464 B2 | | 12/2006 | Shibayama |
| 7,232,697 B2 | | 6/2007 | Hsu et al. |
| 7,535,073 B2 | | 5/2009 | Ezaki |
| 7,638,852 B2 | * | 12/2009 | Hsu et al. ...................... 257/432 |
| 2001/0012225 A1 | | 8/2001 | Rhodes |
| 2001/0017344 A1 | | 8/2001 | Aebi |
| 2002/0011614 A1 | | 1/2002 | Rhodes |
| 2002/0135034 A1 | * | 9/2002 | Shigenaka et al. ............ 257/440 |
| 2004/0149888 A1 | | 8/2004 | Costello |
| 2004/0169625 A1 | | 9/2004 | Park et al. |
| 2004/0178350 A1 | | 9/2004 | Nagano et al. |
| 2004/0222358 A1 | * | 11/2004 | Bui et al. ................... 250/214.1 |
| 2004/0245642 A1 | | 12/2004 | Hasunuma et al. |
| 2005/0090035 A1 | | 4/2005 | Kim |
| 2005/0106872 A1 | | 5/2005 | Hong |
| 2005/0110050 A1 | * | 5/2005 | Walschap et al. ............ 257/222 |
| 2005/0167709 A1 | | 8/2005 | Augusto |
| 2005/0179053 A1 | | 8/2005 | Ezaki et al. |
| 2005/0184322 A1 | | 8/2005 | Inoue |
| 2005/0205954 A1 | | 9/2005 | King et al. |
| 2005/0233493 A1 | | 10/2005 | Augusto |
| 2005/0255625 A1 | | 11/2005 | Janesick et al. |
| 2005/0287479 A1 | | 12/2005 | Moon |
| 2006/0043519 A1 | | 3/2006 | Ezaki |
| 2006/0057759 A1 | | 3/2006 | Zhang et al. |
| 2006/0084195 A1 | | 4/2006 | Lyu |
| 2006/0086956 A1 | | 4/2006 | Furukawa et al. |
| 2006/0121640 A1 | | 6/2006 | Kim |
| 2006/0138498 A1 | | 6/2006 | Kim |
| 2006/0197171 A1 | | 9/2006 | Zhang et al. |
| 2006/0249803 A1 | | 11/2006 | Yamamoto et al. |
| 2006/0267123 A1 | | 11/2006 | Wu et al. |
| 2006/0275945 A1 | | 12/2006 | Yang et al. |
| 2006/0281215 A1 | | 12/2006 | Maruyama et al. |
| 2007/0001100 A1 | | 1/2007 | Hsu et al. |
| 2007/0008421 A1 | * | 1/2007 | Wu et al. ...................... 348/340 |
| 2007/0013020 A1 | | 1/2007 | Blauvelt et al. |
| 2007/0023800 A1 | | 2/2007 | Ohkawa |
| 2007/0052050 A1 | | 3/2007 | Dierickx |
| 2007/0108476 A1 | | 5/2007 | Hong |
| 2007/0117253 A1 | | 5/2007 | Hsu et al. |
| 2007/0207566 A1 | | 9/2007 | Fu et al. |
| 2008/0108167 A1 | | 5/2008 | Abe et al. |
| 2008/0173963 A1 | | 7/2008 | Hsu et al. |
| 2008/0265348 A1 | | 10/2008 | Maas et al. |

FOREIGN PATENT DOCUMENTS

| | | | |
|---|---|---|---|
| CN | 1776917 | | 5/2006 |
| CN | 1877845 | | 12/2006 |
| CN | 1905201 | | 1/2007 |
| JP | 64082666 | | 3/1989 |
| JP | 2005206432 | | 8/1993 |
| JP | 07202161 | | 8/1995 |
| JP | 11008373 | | 1/1999 |
| JP | 2002076312 | | 3/2002 |
| JP | 2003152217 | | 5/2003 |
| JP | 2003158291 | | 5/2003 |
| JP | 2004241653 | | 8/2004 |
| JP | 2004233758 | | 9/2004 |
| JP | 2004-319610 | | 11/2004 |
| JP | 2005150463 | | 6/2005 |
| KR | 1020020005990 | | 1/2002 |
| KR | 102005103782 | | 11/2005 |
| KR | 10-2006-0010899 | * | 2/2006 |
| WO | WO9859373 A1 | | 12/1998 |

OTHER PUBLICATIONS

Chinese Patent Office, Office Action mailed May 8, 2009, Application No. 2007101011893, 6 pages.

Korean Intellectual Property Office, Notice of Preliminary Rejection mailed May 28, 2008, Application No. 10-2007-0045138, 8 pages.

Japanese Patent Office, Office Action mailed Jul. 17, 2009, Application No. 2006-175291, 4 pages (English Translation, 3 pages).

Chinese Patent Office, Office Action mailed Mar. 20, 2009, Application No. 2007101487965, 4 pages.

Chinese Patent Office, Office Action mailed Jul. 10, 2009, Application No. 2008100053075, 9 pages.

Japanese Patent Office, Office Action mailed Feb. 15, 2010, Application No. 2006-175291, 4 pages.

U.S. Patent and Trademark Office, Office Action mailed Dec. 9, 2009, U.S. Appl. No. 11/859,848, 20 pages.

\* cited by examiner

METHOD OF MAKING WAFER STRUCTURE FOR BACKSIDE ILLUMINATED COLOR IMAGE SENSOR

PRIORITY DATA

This application is a continuation of U.S. patent application Ser. No. 11/626,664, filed Jan. 24, 2007, now U.S. Pat. No. 7,638,852, issued Dec. 29, 2009, which claims benefit of U.S. Provisional Patent Application Serial No. 60/798,876, filed May 9, 2006, both of which are incorporated herein by reference in their entirety.

BACKGROUND

An image sensor provides a grid of pixels, such as photosensitive diodes or photodiodes, reset transistors, source follower transistors, pinned layer photodiodes, and/or transfer transistors for recording an intensity or brightness of light. The pixel responds to the light by accumulating a charge—the more light, the higher the charge. The charge can then be used by another circuit so that a color and brightness can be used for a suitable application, such as a digital camera. Common types of pixel grids include a charge-coupled device (CCD) or complimentary metal oxide semiconductor (CMOS) image sensor.

Backside illuminated sensors are used for sensing a volume of exposed light projected towards the backside surface of a substrate. The pixels are located on a front side of the substrate, and the substrate is thin enough so that light projected towards the backside of the substrate can reach the pixels. Backside illuminated sensors provide a high fill factor and reduced destructive interference, as compared to front-side illuminated sensors.

A problem with backside illuminated sensors is that different wavelengths of radiation to be sensed experience different effective absorption depths in the substrate. For example, blue light experiences a more shallow effective absorption depth, as compared to red light. Improvements in backside illuminated sensors and/or the corresponding substrate are desired to accommodate different wavelengths of light.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
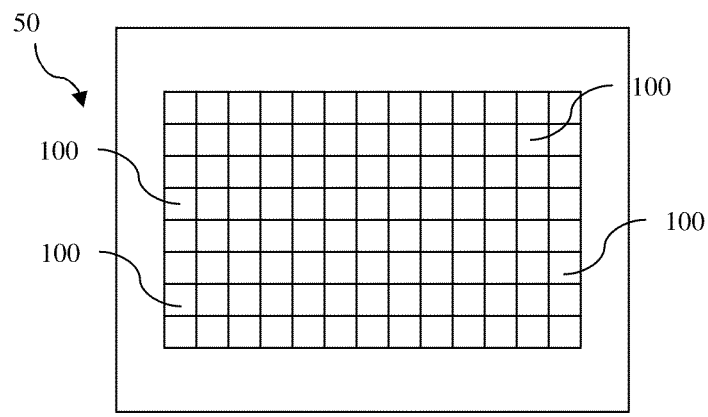
FIG. 1 is a top view of a sensor including a plurality of pixels, according to one or more embodiments of the present invention.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, an image sensor 50 provides a grid of backside illuminated (or back-illuminated) pixels 100. In the present embodiment, the pixels 100 are photosensitive diodes or photodiodes, for recording an intensity or brightness of light on the diode. Alternatively, the pixels 100 may also include reset transistors, source follower transistors, pinned layer photodiodes, and transfer transistors. The image sensor 50 can be of various different types, including a charge-coupled device (CCD), a complimentary metal oxide semiconductor (CMOS) image sensor (CIS), an active-pixel sensor (ACP), or a passive-pixel sensor. Additional circuitry and input/outputs are typically provided adjacent to the grid of pixels 100 for providing an operation environment for the pixels and for supporting external communications with the pixels.

Figure 2:
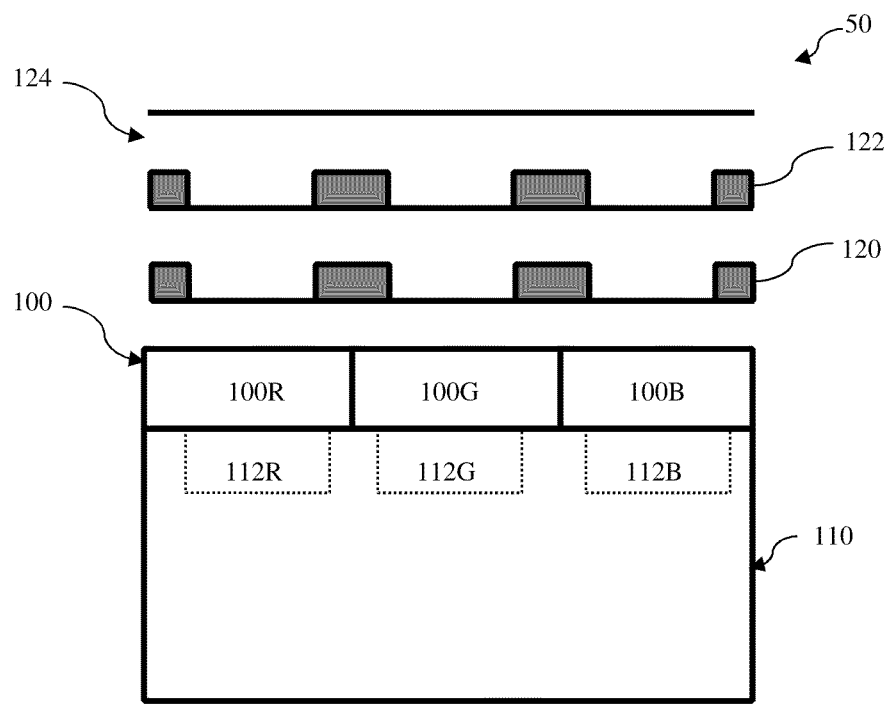
FIGS. 2-5 are sectional views of a sensor having a plurality of backside illuminated pixels, constructed according to aspects of the present disclosure.

Referring now to FIG. 2, the sensor 50 includes a silicon-on-insulator (SOI) substrate 110 including silicon and carbon dioxide. Alternatively, the substrate 110 may comprise an epitaxial layer or other combination of layers. In other embodiments, the substrate 110 may comprise an elementary semiconductor such as silicon, germanium, and diamond. The substrate 110 may also comprise a compound semiconductor such as silicon carbide, gallium arsenic, indium arsenide, and indium phosphide. The substrate 110 may comprise an alloy semiconductor such as silicon germanium, silicon germanium carbide, gallium arsenic phosphide, and gallium indium phosphide.

In the present embodiment, the substrate 110 comprises P-type silicon formed over a silicon dioxide base. Silicon doping may be implemented using a process such as ion implantation or diffusion in various steps. The substrate 110 may comprise lateral isolation features to separate different devices formed on the substrate. The thickness of the substrate 110 has been thinned to allow for etching of the backside of the substrate. This reduction in thickness may be accomplished by back grinding, diamond scrubbing, chemical mechanical planarization (CMP), or other similar techniques.

The sensor 50 includes a plurality of pixels 100 formed on the front surface of the semiconductor substrate 110. For the sake of example, the pixels are further labeled 100R, 100G, and 100B to correspond with example light wavelengths of red, green, and blue, respectively. As noted above, the pixels 100 (also referred to as radiation-sensing elements) sense different wavelengths of radiation (light) and record an intensity or brightness of the radiation (light). The pixels 100 each comprise a light-sensing region (or photo-sensing region) which in the present embodiment is an N-type doped region having dopants formed in the semiconductor substrate 110 by a method such as diffusion or ion implantation. In continuance of the present example, the doped regions are further labeled 112R, 112G, and 112B to correspond with the pixels 100R, 100G, and 100B, respectively. In some embodiments, the doped regions 112 can be varied one from another, such as by having different material types, thicknesses, and so forth.

The sensor 50 further includes additional layers, including first and second metal layers 120, 122 and inter-level dielectric 124. The dielectric layer 124 comprises a low-k material, as compared to a dielectric constant of silicon dioxide. Alternatively, the dielectric layer 124 may comprise carbon-doped silicon oxide, fluorine-doped silicon oxide, silicon oxide, silicon nitride, and/or organic low-k material. The metal layers 120, 122 may include aluminum, copper, tungsten, titanium, titanium nitride, tantalum, tantalum nitride, metal silicide, or any combinations thereof.

Additional circuitry also exists to provide an appropriate functionality to handle the type of pixels 100 being used and the type of light being sensed. It is understood that the wavelengths red, green, and blue are provided for the sake of example, and that the pixels 100 are generally illustrated as being photodiodes for the sake of example.

Figure 3:
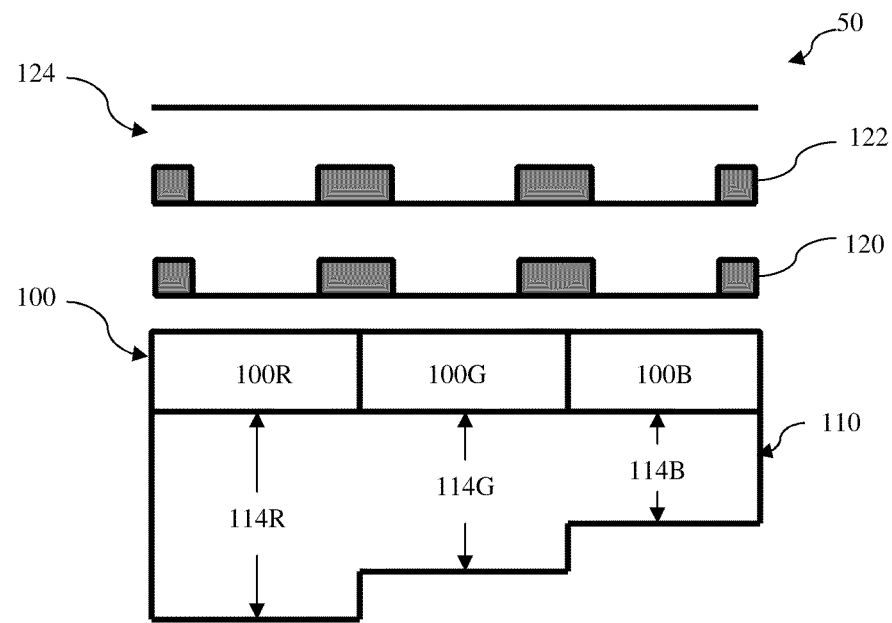

Referring now to FIG. 3, the substrate 110 includes a plurality of absorption depths 114R, 114G, and 114B located beneath the corresponding pixels 100R, 100G, and 100B, respectively. Each wavelength (e.g., red, green, and blue light) has a different effective absorption depth when it passes through the substrate 110. For example, blue light experiences a more shallow effective absorption depth, as compared to red light. Thus, the absorption depth 114R, 114G, and 114B for each color pixel 100R, 100G, and 100B varies accordingly. As an example, the absorption depth 114R beneath the pixel 100R for red light is between 0.35 μm to 8.0 μm. The absorption depth 114G beneath the pixel 100G for green light is between 0.15 μm to 3.5 μm. The absorption depth 114B beneath the pixel 100B for blue light is between 0.10 μm to 2.5 μm.

The absorption depths 114 may be formed by a variety of different techniques. One technique is to apply a photosensitive layer to the backside of the substrate 110, pattern the photosensitive layer, and etch the substrate according to the pattern. For example, a wet etch process may be used to remove the unwanted silicon substrate. This process can be repeated to create different absorption depths.

Figure 4:
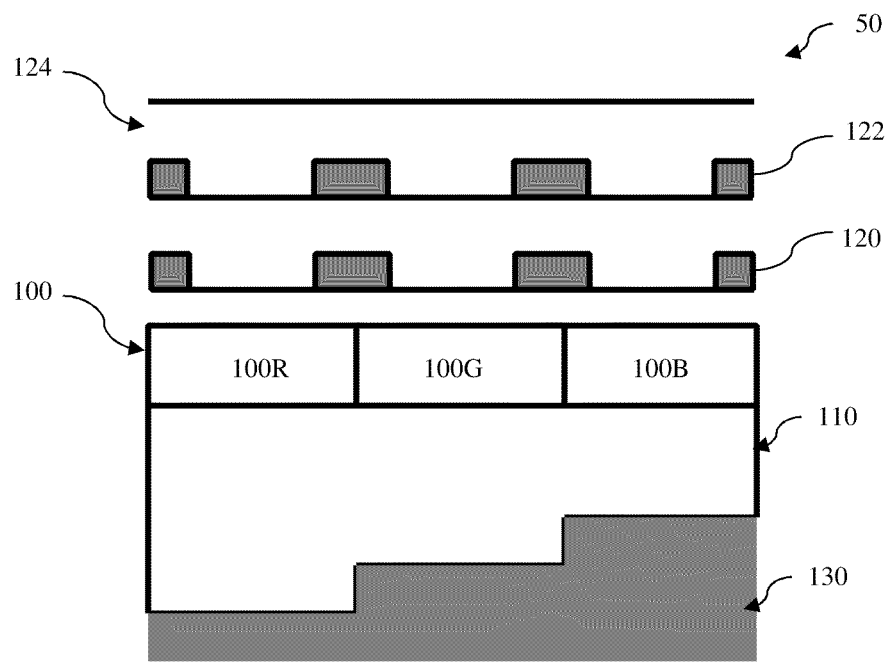
Figure 5:
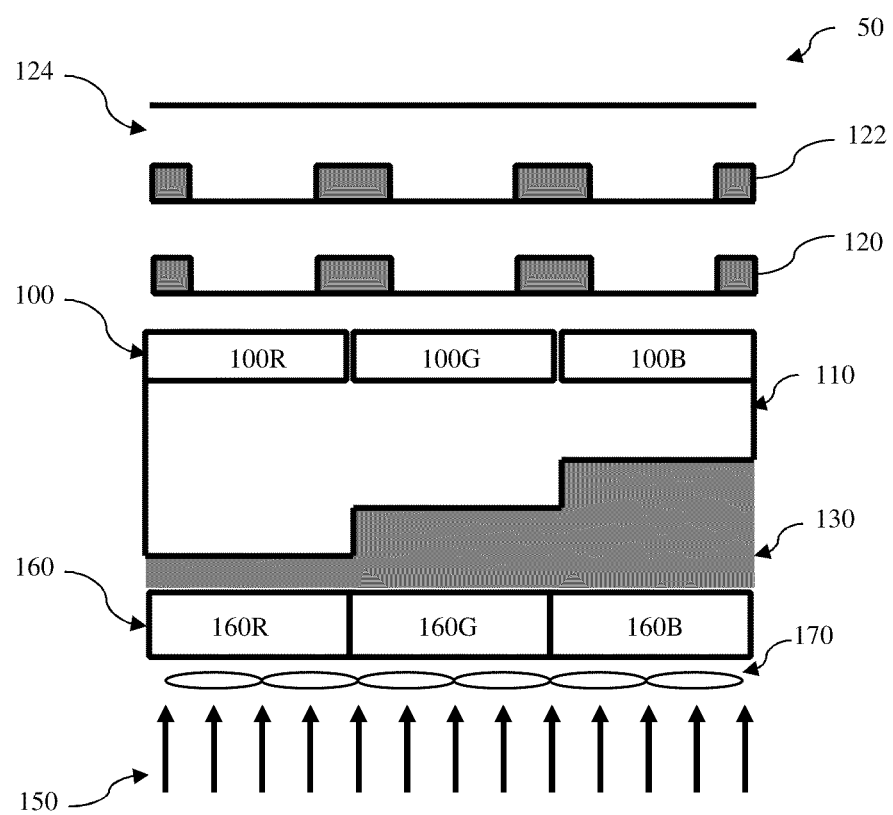

Referring now to FIG. 4, the sensor 50 includes a planarization layer 130 located between the pixels 100R, 100G, and 100B and the color filters 160R, 160G, and 160B (shown in FIG. 5). The planarization layer 130 is made up of an organic or polymeric material that has a high transmittance rate for visible light. This allows light to pass through the planarization layer 130 with very little distortion so that it can be detected at the light-sensing regions in the substrate 110. The planarization layer 130 may be formed by a spin coating method which provides for a uniform and even layer.

Referring now to FIG. 5, the sensor 50 is designed to receive light 150 directed towards the back surface of the semiconductor substrate 110 during applications, eliminating any obstructions to the optical paths by other objects such as gate features and metal lines, and maximizing the exposure of the light-sensing region to the illuminated light. The illuminated light 150 may not be limited to visual light beam, but can be infrared (IR), ultraviolet (UV), and other radiation.

The sensor 50 further comprises a color filter layer 160. The color filter layer 160 can support several different color filters (e.g., red, green, and blue), and may be positioned such that the incident light is directed thereon and there through. In one embodiment, such color-transparent layers may comprise a polymeric material (e.g., negative photoresist based on an acrylic polymer) or resin. The color filter layer 160 may comprise negative photoresist based on an acrylic polymer including color pigments. In continuance of the present example, color filters 160R, 160G, and 160B correspond to pixels 100R, 100G, and 100B, respectively.

The sensor 50 may comprise a plurality of lenses 170, such as microlenses, in various positional arrangements with the pixels 100 and the color filters 160, such that the backside-illuminated light 150 can be focused on the light-sensing regions.

Figure 6:
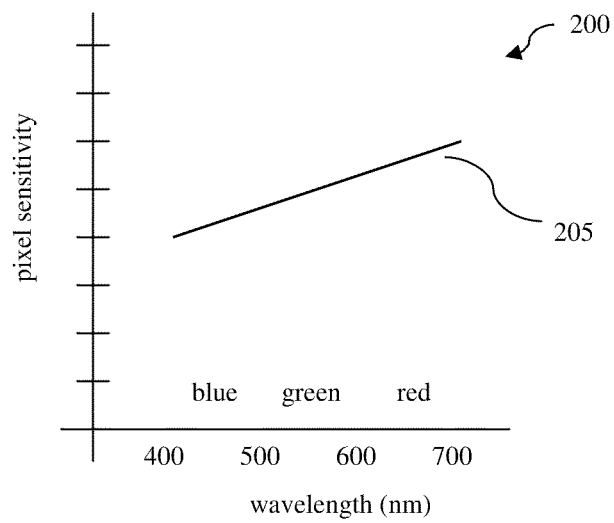
FIG. 6 is a graph of light sensitivity vs. wavelength for a sensor having backside substrate thicknesses of uniform size.

Referring to FIG. 6, a graph 200 shows a comparison of the sensitivities for the various pixels when responding to red, green, or blue light. The vertical axis of the graph 200 shows light or radiation sensitivity, and the horizontal axis shows light or radiation wavelength. As can be seen from the graph 200, if the absorption depths are uniform, the light sensitivity 205 between the different pixels in response to red, green, and blue radiation wavelengths would be different. The blue light has a shorter wavelength than the green and red light and thus, the blue light has a shorter effective absorption depth in the substrate. In the present example, the pixel for receiving blue light would have a reduced level of light sensitivity, as compared to the pixels for receiving green and red light.

Figure 7:
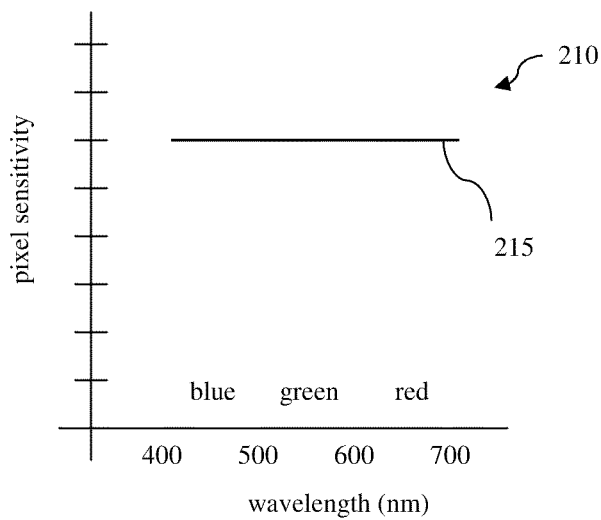
FIG. 7 is a graph of light sensitivity vs. wavelength for a sensor having backside substrate thicknesses of varying size.

Referring now to FIG. 7, a graph 210 shows a comparison of the sensitivities for the pixels 100R, 100G, and 100B, when responding to red, green, or blue light, respectively. Since the sensor 50 has absorption depths 114R, 114G, and 114B with varying thicknesses, then a more even distribution of light sensitivity 215 can be obtained between the different pixels 100R, 100G, and 100B in response to different wavelengths of radiation. In the present example, the wavelengths are red, green, and blue, and the pixels 100R, 100G, and 100B have corresponding color filters 160R, 160G, and 160B. It is understood that variations in junction depths and dopant concentrations may be combined with aspects of the present disclosure to achieve a more uniform spectral response and to improve performance of the sensor 50.

Thus, provided is an improved sensor device and method for manufacturing same. In one embodiment, a backside illuminated sensor includes a semiconductor substrate having a front surface and a back surface and a plurality of pixels formed on the front surface of the semiconductor substrate. The sensor further includes a plurality of absorption depths formed within the back surface of the semiconductor substrate. Each of the plurality of absorption depths is arranged according to each of the plurality of pixels.

In some embodiments, the plurality of pixels are of a type to form a CMOS image sensor. In other embodiments, the plurality of pixels are of a type to form a charge-coupled device. In other embodiments, the plurality of pixels are of a type to form an active-pixel sensor. In still other embodiments, the plurality of pixels are of a type to form a passive-pixel sensor.

In some other embodiments, the sensor includes red, green, and blue color filters aligned with corresponding red, green, and blue pixels and a planarization layer that lies between the color filters and the pixels. The sensor further includes microlenses over the color filters, a dielectric layer disposed above the front surface of the semiconductor substrate, and a plurality of metal layers over the semiconductor substrate.

In another embodiment, a method is provided for forming a backside illuminated sensor. The method includes providing a semiconductor substrate having a front surface and a back surface and forming a first, second, and third pixel on the front surface of the semiconductor substrate. The method further includes forming a first, second, and third thickness within the back surface of the semiconductor substrate, wherein the first, second, and third thickness lies beneath the first, second, and third pixel, respectively. In some embodiments, the method includes forming color filters aligned with the plurality of pixels and forming a planarization layer between the color filters and pixels. The method further includes providing a dielectric layer and a plurality of metal layers above the front surface of the semiconductor substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A backside illuminated sensor, comprising:
   a semiconductor substrate having a substantially planar front surface and a back surface;
   a plurality of pixels formed on the substantially planar front surface of the semiconductor substrate; and
   wherein the semiconductor substrate comprises a plurality of thicknesses between the substantially planar front surface and the back surface, wherein at least one pixel from the plurality of pixels is aligned with at least one thickness from the plurality of thicknesses, and
   wherein the plurality of pixels comprises a first pixel and a second pixel and the plurality of thicknesses comprises a first thickness aligned with the first pixel and a second thickness aligned with the second pixel.

2. The sensor of claim 1, wherein the plurality of pixels is of a type selected from the group consisting of: a CMOS image sensor, a charge-coupled device, an active-pixel sensor, and a passive-pixel sensor.

3. The sensor of claim 1, wherein the semiconductor substrate is a silicon-on-insulator substrate.

4. The sensor of claim 1, wherein:
   the plurality of pixels further comprises a third pixel; and
   the plurality of thicknesses further comprises a third thickness, the third thickness being aligned with the third pixel.

5. The sensor of claim 1, wherein the first thickness is between 0.35 µm to 8.0 µm.

6. The sensor of claim 1, wherein the second thickness is between 0.15 µm to 3.5 µm.

7. The sensor of claim 4, wherein the third thickness is between 0.10 µm to 2.5 µm.

8. The sensor of claim 4, further comprising red, green, and blue color filters aligned with the first, second, and third pixels, respectively.

9. The sensor of claim 8, further comprising a planarization layer located between the back surface of the semiconductor substrate and the red, green, and blue color filters.

10. The sensor of claim 9, wherein the planarization layer is an organic or polymeric material.

11. The sensor of claim 1, further comprising:
    a plurality of metal layers over the semiconductor substrate; and
    a dielectric layer disposed above the substantially planar front surface of the semiconductor substrate.

12. An integrated circuit comprising:
    a substrate having a substantially planar front surface and a back surface;
    a first radiation-sensing element disposed on the substantially planar front surface of a first portion of the substrate, wherein the first radiation-sensing element includes a first doped region disposed in the substrate;
    a second radiation-sensing element disposed on the substantially planar front surface of a second portion of the substrate, wherein the second radiation-sensing element includes a second doped region disposed in the substrate; and
    wherein the first portion of the substrate has a first thickness associated with a first radiation absorption characteristic and the second portion of the substrate has a second thickness associated with a second radiation absorption characteristic different from the first radiation absorption characteristic.

13. The integrated circuit of claim 12, further comprising a planarization layer and color filter disposed over the substrate.

14. The integrated circuit of claim 12, wherein the first and second thicknesses are between the substantially planar front surface and the back surface of the substrate.

15. The integrated circuit of claim 14, wherein the first thickness defines a first absorption depth for a first radiation directed towards the first radiation-sensing element from the back surface and the second thickness defines a second absorption depth for a second radiation directed towards the second radiation-sensing element from the back surface.

16. An integrated circuit comprising:
    a substrate having a substantially planar first surface and a second surface opposite the first surface;
    a first radiation-sensing element and a second radiation-sensing element disposed on the substantially planar first surface of the substrate; and
    wherein the substrate comprises a first thickness and a second thickness, wherein the first thickness and the second thickness are between the substantially planar first surface and the second surface, and further wherein the first thickness is aligned with the first radiation-sensing element and the second thickness is aligned with the second radiation-sensing element.

17. The integrated circuit of claim 16, wherein the first thickness comprises a first absorption depth through a first portion of the substrate and the second thickness comprises a second absorption depth through a second portion of the substrate.

18. The integrated circuit of claim 16, further comprising a color filter disposed over the second surface of the substrate.

19. The integrated circuit of claim 18, further comprising a planarization layer located between the second surface of the substrate and the color filter.

20. The integrated circuit of claim 19, further comprising a lens disposed over the color filter.

* * * * *